United States Patent
Basin et al.

(10) Patent No.: US 11,183,616 B2
(45) Date of Patent: Nov. 23, 2021

(54) PHOSPHOR CONVERTER STRUCTURES FOR THIN FILM PACKAGES AND METHOD OF MANUFACTURE

(71) Applicant: Lumileds LLC, San Jose, CA (US)

(72) Inventors: Grigoriy Basin, San Francisco, CA (US); Lex Alan Kosowsky, San Jose, CA (US); Hideo Kageyama, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 4 days.

(21) Appl. No.: 16/142,247

(22) Filed: Sep. 26, 2018

(65) Prior Publication Data

US 2020/0098950 A1    Mar. 26, 2020

(51) Int. Cl.
  *H01L 33/00* (2010.01)
  *H01L 33/50* (2010.01)
  *H01L 33/46* (2010.01)

(52) U.S. Cl.
  CPC ............ *H01L 33/502* (2013.01); *H01L 33/46* (2013.01); *H01L 2933/0025* (2013.01); *H01L 2933/0041* (2013.01)

(58) Field of Classification Search
  CPC .............................. H01L 33/502; H01L 33/46
  See application file for complete search history.

(56) References Cited

U.S. PATENT DOCUMENTS

| | | |
|---|---|---|
| 2012/0052608 A1 | 3/2012 | Yoo et al. |
| 2013/0187540 A1 | 7/2013 | Tischler |
| 2016/0043285 A1 * | 2/2016 | Basin ............... H01L 33/644<br>257/98 |
| 2017/0365747 A1 | 12/2017 | Basin et al. |
| 2018/0356716 A1 * | 12/2018 | Hashizume ........... H01L 33/502 |
| 2019/0278091 A1 * | 9/2019 | Smits .................... H04N 13/363 |
| 2019/0294032 A1 * | 9/2019 | Hirano ................... G03B 21/16 |

FOREIGN PATENT DOCUMENTS

EP    2731152 A2    5/2014

OTHER PUBLICATIONS

European Search Report corresponding to EP 18205710, dated Apr. 24, 2019, 1 page.
International Search Report corresponding to PCT/IB2019/058106, dated Oct. 31, 2019, 1 page.
The extended European Search Report, corresponding to EP18205710.9, dated May 3, 2019, 8 pages.
From the EPO as the ISA, International Search Report and Written Opinion corresponding to PCT/IB2019/058106, dated Oct. 31, 2019, 10 pages.

\* cited by examiner

*Primary Examiner* — Kimberly N Rizkallah
*Assistant Examiner* — Alexander Belousov

(57) ABSTRACT

Light emitting devices (LEDs) and methods of manufacturing LEDs are described. A method includes providing a layer of a wavelength converting material on a temporary tape. The wavelength converting material includes at least a binder or matrix material, particles of a non-luminescent material, and phosphor particles and has a concentration of 60%-90% by volume particles of the non-luminescent material and phosphor particles. The layer of the wavelength converting material is separated on the temporary tape to form multiple wavelength converting structures, which are provided on an array type frame. Heat and pressure are applied to the wavelength converting structures on the array type frame.

17 Claims, 6 Drawing Sheets

PHOSPHOR CONVERTER STRUCTURES FOR THIN FILM PACKAGES AND METHOD OF MANUFACTURE

BACKGROUND

Semiconductor light-emitting devices or optical power emitting devices (such as devices that emit ultraviolet (UV) or infrared (IR) optical power), including light emitting diodes, resonant cavity light emitting diodes, vertical cavity laser diodes, and edge emitting lasers, are among the most efficient light sources currently available. Due to their compact size and lower power requirements, for example, semiconductor light or optical power emitting devices (referred to herein as LEDs for simplicity) are attractive candidates for light sources, such as camera flashes, for hand-held battery-powered devices, such as cameras and cell phones. They may also be used, for example, for other applications, such as for automotive lighting, torch for video, and general illumination, such as home, shop, office and studio lighting, theater/stage lighting and architectural lighting. A single LED may provide light that is less bright than a typical light source, and, therefore, arrays of LEDs may be used for such applications.

SUMMARY

Light emitting devices (LEDs) and methods of manufacturing LEDs are described. A method includes providing a layer of a wavelength converting material on a temporary tape. The wavelength converting material includes at least a binder or matrix material, particles of a non-luminescent material, and phosphor particles and has a concentration of 60%-90% by volume particles of the non-luminescent material and phosphor particles. The layer of the wavelength converting material is separated on the temporary tape to form multiple wavelength converting structures, which are provided on an array type frame. Heat and pressure are applied to the wavelength converting structures on the array type frame.

DETAILED DESCRIPTION OF THE PREFERRED EMBODIMENTS

Figure 1:
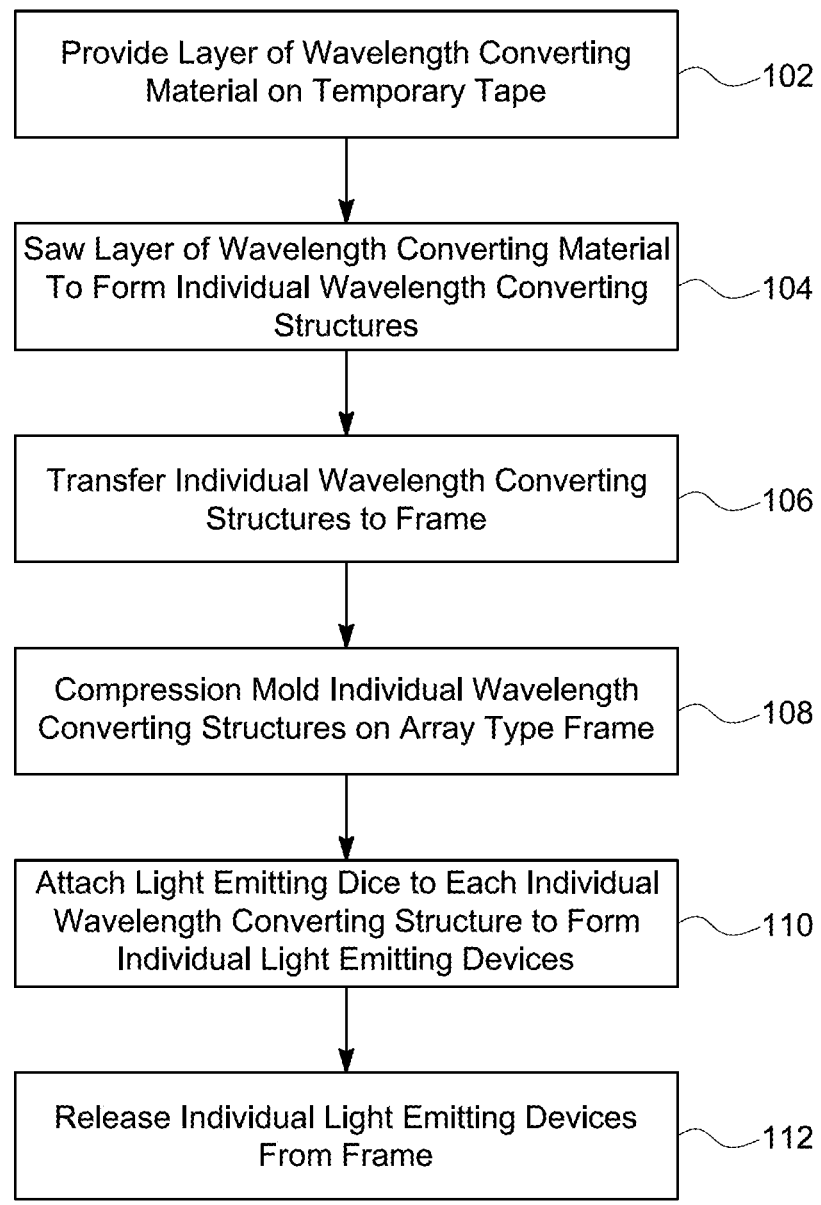
FIG. 1 is a flow diagram of an example method of manufacturing a light emitting device (LED)

Applications, such as the camera flash, automotive lighting and general lighting mentioned above, may make use of light emitting devices (LEDs) as white light sources. Such LEDs may be referred to as white LEDs. White LEDs may appear to emit white light from the perspective of the viewer when the LEDs are in an on state. However, they may actually be made up of light emitting semiconductor structures that emit non-white pump light (e.g., blue or UV light) as well as wavelength converting structures that make the non-white pump light appear white to the viewer.

In some applications, such as where arrays of LEDs are used, it may be desirable to prevent un-converted pump light and converted light from seeping through lateral sides of the LEDs and, for example, into adjacent LEDs. In such applications, reflectors may sometimes be disposed adjacent the side edges of each LED to prevent light from escaping the LED through the sides. Conventionally, these reflectors are thick (e.g., over 25 microns thick) to prevent the pump light from seeping through. However, it may also be possible to coat the side surfaces of LEDs with a non-metallic, thin film reflector, such as a Bragg reflector, which may be much thinner (e.g., 1-10 microns thick). Use of non-metallic, thin film reflectors may be desirable in applications such as where close placement of LEDs is required.

Non-metallic, thin film reflectors are typically made from materials, such as AlOx, $TiO_2$, $TaO_2$, $SiO_2$, $Nb_2O_5$, etc., which have low coefficients of thermal expansion (CTEs ~6-20 ppm) in comparison to materials, such as phosphor in glass or ceramic phosphor, that conventionally form the wavelength converting structures. If a non-metallic, thin film reflector is coated on side surfaces of an LED that includes a light emitting semiconductor structure and a wavelength converting structure, the non-metallic, thin film reflector may crack due to CTE mismatch between the non-metallic, thin film reflector and the wavelength converting structure.

In embodiments described herein, wavelength converting structures may be formed from a wavelength converting material that is highly loaded and has a better CTE match with non-metallic, thin film reflector materials than the conventional wavelength converting materials described above. Such highly loaded wavelength converting material may be a molding compound formed from a binder or matrix material, such as silicone, that is highly loaded with phosphor particles as well as solid particles of a non-luminescent material, such as silica ($SiO_2$ in amorphous or crystalline form). A concentration of solids (the phosphor and solid, non-luminescent particles) in the molding compound may be 60%-90% by volume.

While such a highly loaded wavelength converting material may provide a better CTE match for non-metallic, thin film reflector materials, due to the high concentration by volume of solids in the wavelength converting molding compound, when the material is sawed into individual wavelength converting structures for attachment to individual LED dies, the edges become rough (e.g., 300-1,000 or more nm roughness). Phosphor structures with such highly rough side edges may be incompatible for use in conjunction with non-metallic, thin film reflectors because the highly rough side surfaces will cause light incident thereon to re-direct and leak through the non-metallic, thin film reflector and out through the side surfaces of the LED. Embodiments described herein provide methods whereby a highly loaded wavelength converting structure, such as described above, may be manufactured to have sufficiently smooth side surfaces (e.g., 100 nm roughness or less). While embodiments are described herein with respect to a highly loaded wavelength converting material, one of ordinary skill in the art will recognize that the methods described herein may be used with any type of wavelength converting structure where surface smoothness is desirable.

FIG. 1 is a flow diagram 100 of an example method of manufacturing an LED. FIGS. 2A, 2B, 2C, 2D, 2E, 2F and 2G are diagrams of the example LED at various stages during the manufacturing process.

Figure 2A:
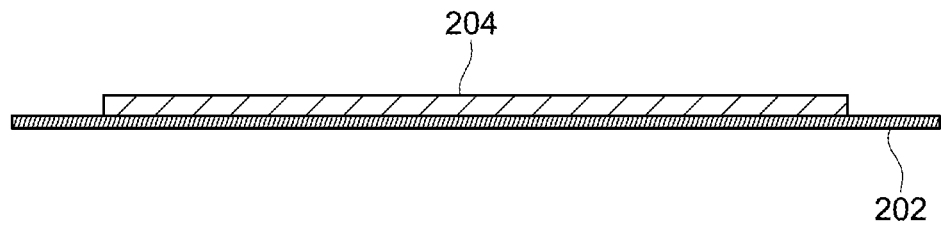
FIGS. 2A, 2B, 2C, 2D, 2E, 2F and 2G are diagrams of the example LED at various stages during the manufacturing process.

In the example illustrated in FIG. 1, a layer of wavelength converting material is provided on a temporary tape (102). The wavelength converting material may be a molding compound formed from a binder or matrix material, such as silicone, that is highly loaded with phosphor particles as well as solid particles of a non-luminescent material, such as silica ($SiO_2$). A concentration of solids (the phosphor and non-luminescent particles) in the molding compound may be between 60 and 90% by volume. The temporary tape may be any suitable sawing tape. FIG. 2A is a diagram of an example 200A of a layer of a wavelength converting material 204 disposed on a temporary tape 202.

In embodiments, the wavelength converting material may be formed for use with a semiconductor structure that emits blue light. In such embodiments, the wavelength converting material may include, for example, particles of a yellow emitting wavelength converting material or green and red emitting wavelength converting materials, which will produce white light when the light emitted by the respective phosphors combines with the blue light emitted by the light emitting semiconductor structure. In other embodiments, the wavelength converting material may be formed for use with a semiconductor structure that emits UV light. In such embodiments, the wavelength converting material may include, for example, particles of blue and yellow wavelength converting materials or particles of blue, green and red wavelength converting materials. Wavelength converting particles emitting other colors of light may be added to tailor the spectrum of light emitted from the LED.

In embodiments, the luminescent, solid particles in the wavelength converting material may be composed of $Y_3Al_5O_{12}:Ce^{3+}$. The luminescent, solid particles may be an amber to red emitting rare earth metal-activated oxonitrido-alumosilicate of the general formula $(Ca_{1-x-y-z}Sr_xBa_y Mg_z)_{1-n}(Al_{1-a+b}Ba)Si_{1-b}N_{3-b}O_b:RE_n$ wherein $0 \leq x \leq 1$, $0 \leq y \leq 1$, $0 \leq z \leq 1$, $0 \leq a \leq 1$, $0 \leq b \leq 1$ and $0.002 \leq n \leq 0.2$, and RE may be selected from europium(II) and cerium(III).

In other embodiments, the luminescent, solid particles in the wavelength converting material may include aluminum garnet phosphors with the general formula $(Lu_{1-x-y-a-b}Y_xGd_y)_3(Al_{1-z}Ga_z)_5O_{12}: Ce_aPr_b$, wherein $0<x<1$, $0<y<1$, $0 \leq z \leq 0.1$, $0 \leq a \leq 0.2$ and $0 \leq b \leq 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_{5-a}Al_aN_{8-a}O_a:Eu^{2+}$, wherein $0 \leq a<5$, $0 \leq x \leq 1$, $0 \leq y \leq 1$, and $0 \leq z \leq 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu_a^{2+}$; (a=0.002-0.2, b=0.0-0.25, c=0.0-0.25, x=1.5-2.5, y=1.5-2.5, z=1.5-2.5) including, $SrSi_2N_2O_2:Eu^{2+}$; $(Sr_{1-u-v-x}Mg_uCa_vBaO(Ga_{2-y-z}Al_yIn_z)S_4)$:$Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0 \leq x \leq 1$ including, CaS:$Eu^{2+}$ and SrS:$Eu^{2+}$. Other suitable phosphors include, $CaAlSiN_3:Eu^{2+}$, $(Sr,Ca)AlSiN_3:Eu^{2+}$, and $(Sr, Ca, Mg, Ba, Zn)(Al, B, In, Ga)(Si, Ge)N_3:Eu^{2+}$.

In other embodiments, the luminescent, solid particles in the wavelength converting material may also have a general formula $(Sr_{1-a-b}Ca_bBa_cMg_dZn_e)Si_xN_yO_z:Eu_a^{2+}$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The luminescent, solid particles in the wavelength converting material may also have a general formula of MmAaBbOoNn:Zz where an element M is one or more bivalent elements, an element A is one or more trivalent elements, an element B is one or more tetravalent elements, O is oxygen that is optional and may not be in the phosphor plate, N is nitrogen, an element Z that is an activator, n=2/3m+a+4/3b-2/3o, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at least one or more elements selected from Eu (europium), Mg (manganese), Sm (samarium) and Ce (cerium). The element A can be Al (aluminum), the element B can be Si (silicon), and the element Z can be Eu (europium).

The luminescent, solid particles in the wavelength converting material may also be an $Eu^{2+}$ activated Sr—SiON having the formula $(Sr_{1-a-b}Ca_bBa_c)Si_xN_yO_x:Eu_a$, wherein a=0.002-0.2, b=0.0-0.25, c=0.0-0.25, x=1.5-2.5, y=1.5-2.5.

The luminescent, solid particles in the wavelength converting material may also be a chemically-altered Ce:YAG (Yttrium Aluminum Garnet) phosphor that is produced by doping the Ce:YAG phosphor with the trivalent ion of praseodymium (Pr). The luminescent, solid particles in the wavelength converting material may include a main fluorescent material and a supplemental fluorescent material. The main fluorescent material may be a Ce:YAG phosphor and the supplementary fluorescent material may be europium (Eu) activated strontium sulfide (SrS) phosphor ("Eu:SrS"). The main fluorescence material may also be a Ce:YAG phosphor or any other suitable yellow-emitting phosphor, and the supplementary fluorescent material may also be a mixed ternary crystalline material of calcium sulfide (CaS) and strontium sulfide (SrS) activated with europium $((Ca_xSr_{1-x})S:Eu^{2+})$. The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula $(Sr_{1-x-y-z}Ba_xCa_y)_2Si_5N_8:Eu_z^{2+}$ where $0 \leq x$, $y \leq 0.5$ and $0 \leq z \leq 0.1$.

In embodiments, the luminescent, solid particles in the wavelength converting material may include strontium-lithium-aluminum: europium (II) ion ($SrLiAl_3 N_4:Eu^{2+}$) class (also referred to as SLA), including $MLiAl_3N_4: Eu^{2+}$ (M=Sr, Ba, Ca, Mg). In a specific embodiment, the luminescent particles may be selected from the following group of luminescent material systems: $MLiAl_3N_4$:Eu (M=Sr, Ba, Ca, Mg), $M_2SiO_4$:Eu (M=Ba, Sr, Ca), $MSe_{1-x}S_x$:Eu (M=Sr, Ca, Mg), $MSr_2S_4$:Eu (M=Sr, Ca), $M_2SiF_6$:Mn (M=Na, K, Rb), $M_2TiF_6$:Mn (M=Na, K, Rb), $MSiAlN_3$:Eu (M=Ca, Sr), $M_8Mg(SiO_4)_4Cl_2$:Eu (M=Ca, Sr), $M_3MgSi_2O_8$:Eu (M=Sr, Ba, Ca), $MSi_2O_2N_2$:Eu (M=Ba, Sr, Ca), $M_2Si_{5-x}Al_xO_xN_{8-x}$:Eu (M=Sr, Ca, Ba). However, other systems may also be of interest and may be protected by a coating. Also combinations of particles of two or more different luminescent materials may be applied, such as e.g. a green or a yellow luminescent material in combination with a red luminescent material.

In embodiments, the wavelength converting material may include a blend of any of the above-described phosphors.

Materials and concentrations of the non-luminescent, solid particles may be chosen at least in part based on the chosen phosphor or phosphors such that the molding compound has a CTE that matches or closely matches the CTE of a non-metallic, thin film reflector that is to be coated on side surfaces of the light emitting semiconductor structure and wavelength converting structure. The CTE of the molding compound can be around 20 PPM if the loading is close to 90%. Further, in order to maximize the optical performance, by minimizing the scattering in the molding compound, the refraction index of the inert material may be matched as close as possible to the refraction index of the binder. For example, the refraction index of the binder may be 1.5, and the refraction index of the SiO2 is 1.46. For another example, a binder with a refraction index of 1.41 may be used in combination with SiO2. The volume % may calculated by taking into account of the mass of each of the solid components plus the mass of the binder divided and the specific gravity of each component.

Figure 2B:
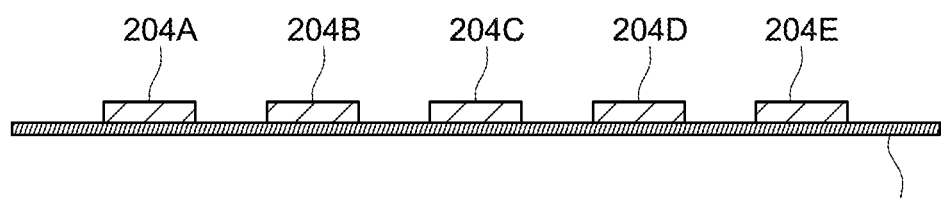
Figure 2B:
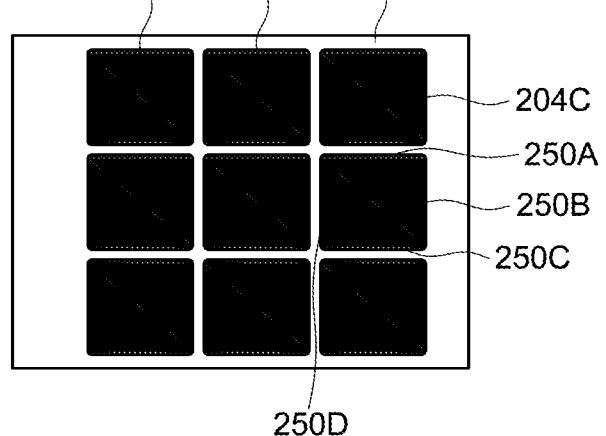

Referring back to FIG. 1, the layer of the wavelength converting material may be sawed or otherwise separated into individual wavelength converting structures (104). FIG. 2B is a diagram of an example of the individual wavelength converting structures 204 disposed on the temporary tape 202 after sawing or separation. Both a side view 200B and a top view 200C of the tape 202 are provided in FIG. 2B. In the side view 200B, five wavelength converting structures 204A, 204B, 204C, 204D and 204E are shown provided on the temporary tape 202. In the top view 200C, nine wavelength converting structures are shown, including the wavelength converting structures 204A, 204B and 204C. While five and nine wavelength converting structures are illustrated in views 200B and 200C in FIG. 2B, one of ordinary skill in the art will recognize that the wavelength converting layer 204 may be separated into any number of wavelength converting structures on the temporary tape 202 within the scope of the embodiments described herein. As mentioned above, at this point in the process, due, for example, to displacement of particles in the highly loaded wavelength converting molding compound, side edges (e.g., 250A, 250B, 250C and 250D as labeled for one of the wavelength converting structures in top view 200C of FIG. 2B) may have an undesirably high roughness, such as 300-1,000 or more nm roughness.

Figure 2C:
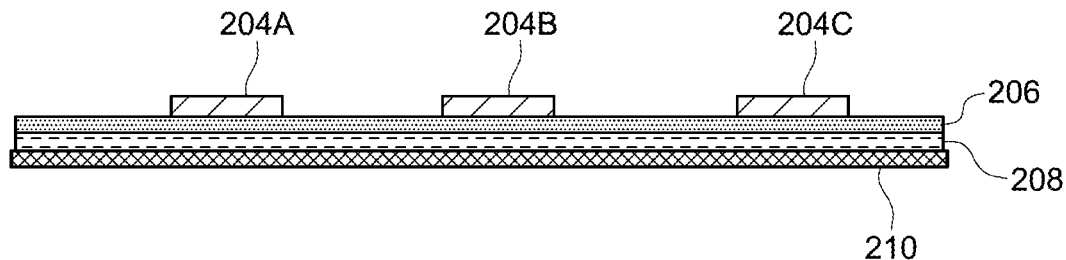
Figure 2D:
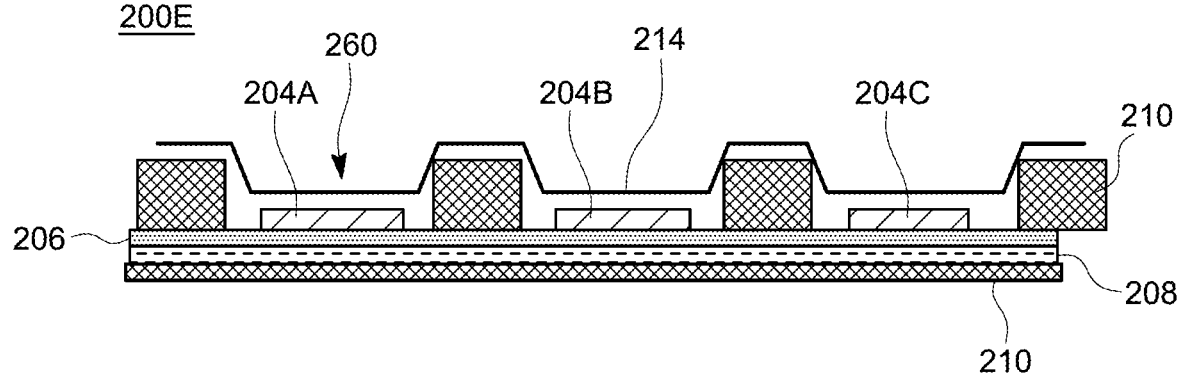

The individual wavelength converting structures may be transferred from the temporary tape 202 (106). FIGS. 2C and 2D are diagrams 200D and 200E showing the wavelength converting structures 204A, 204B and 204C after transfer. In the example illustrated in FIG. 2C, the wavelength converting structures 204A, 204B and 204C are provided on a structure, which may be formed from a metal frame 210 that is adhered to another tape 206, such as a Kapton tape, via a thermal release tape or layer 208. In the example illustrated in FIG. 2D, the frame 210 includes raised regions that define recessed areas 260 in which respective wavelength converting structures are to be compressed. While not visible in the side view in FIG. 2D, the raised regions may form an array such that each individual wavelength converting structure is disposed in a respective recessed area 260 in the frame 210. A release film 214 may be stretched over the frame 210 and the individual wavelength converting structures 204A, 204B and 204C.

The individual wavelength converting structures may be compression molded on the tape 206 and within the frame 210 (108). In embodiments, the structure, including the tape 206, the thermal release tape or layer 208, and the metal frame 210 may be placed within a diaphragm 216 and subjected to pressure and heat sufficient to cause the individual wavelength converting structures to flow within the respective recessed areas 260A, 260B and 260C. In embodiments, an effective pressure may be in a range of 0.7-0.8 Mpa and an effective heat may be in a range of 50-90° C.

Figure 2E:
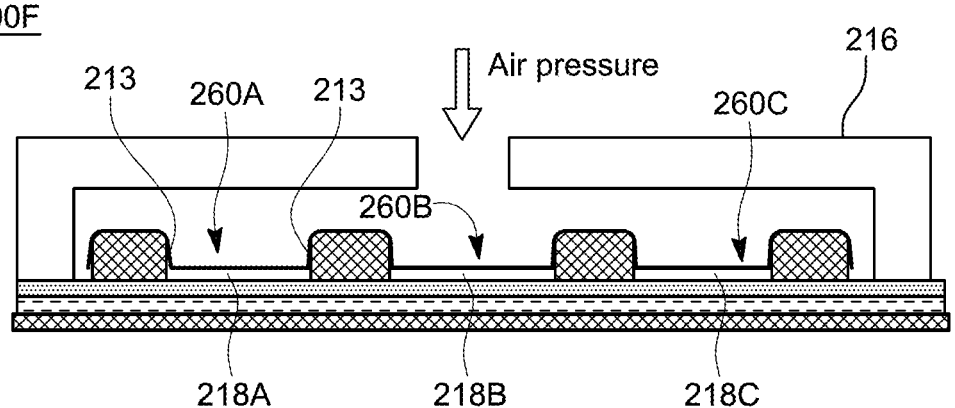

FIG. 2E is a diagram 200F of the wavelength converting structures after compression using the diaphragm 216. As illustrated, individual wavelength converting structures 218A, 218B and 218C take the shape of the respective recessed areas 260A, 260B and 260C in which they are disposed. The raised portions of the frame 210 may have smooth inner walls 213 such that the individual wavelength converting structures 218, after compression, will have smooth edges (e.g., 100 nm roughness or less) that are, for example, suitable for use with a thin film reflector such as a Bragg reflector (not shown).

A respective light emitting die may be attached to each individual wavelength converting structure (110). In embodiments, the wavelength converting molding compound may have enough adhesion such that the light emitting dies may be attached thereto without any additional adhesive. The dice may thus be attached using heat to the individual wavelength converting structures, such as by using the heated collet of a die attach machine. Conventionally, a wavelength converting structure would be attached to a die using some type of intervening adhesive material, which may cause wave guiding at the interface with the adhesive material. Because the wavelength converting structures formed using the above-mentioned materials and using the methods described above may have sufficient adhesion such that the intervening adhesive material is not needed, such light guiding may be eliminated, further reducing the potential for light leakage through the sides of the LEDs and any thin film reflector coated thereon.

Figure 2F:
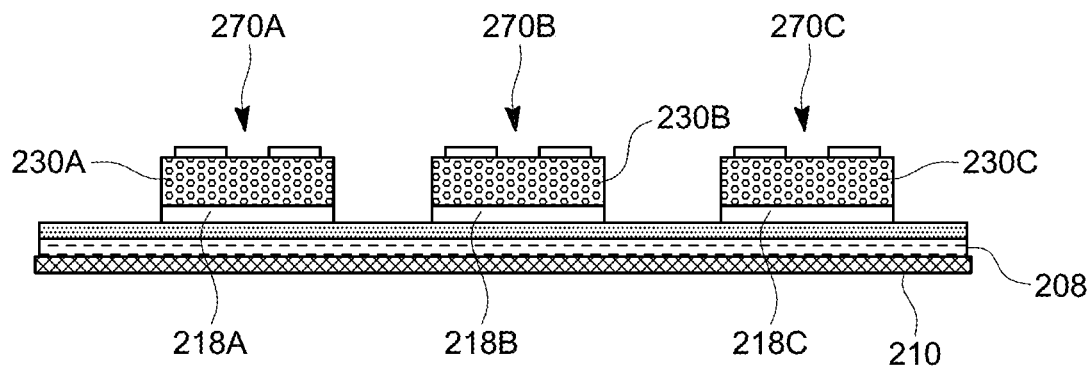
Figure 2G:
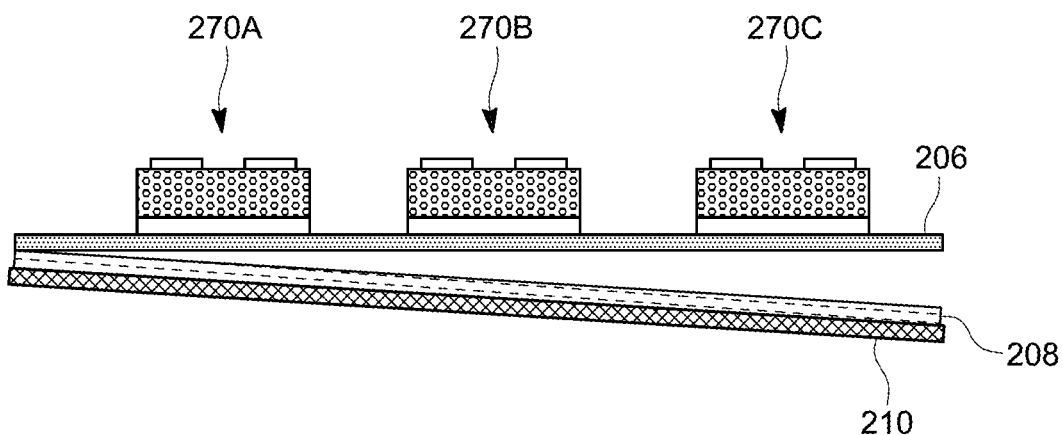

The dies may then be cured, for example, at a temperature of 150° C. over eight hours. FIG. 2F is a diagram 200G of individual LEDs 270A, 270B and 270C after attaching the light emitting dies 230A, 230B and 230C to their respective wavelength converting structures 218A, 218B and 218C and subsequent curing. The individual LEDs 270A, 270B and 270C may then be released from the frame 210, for example, by heating the thermal release tape or layer 208 (112). FIG. 2G is a diagram 200H showing LEDs 270A, 270B and 270C, attached to the tape 206, formed by the method 100.

Figure 3A:
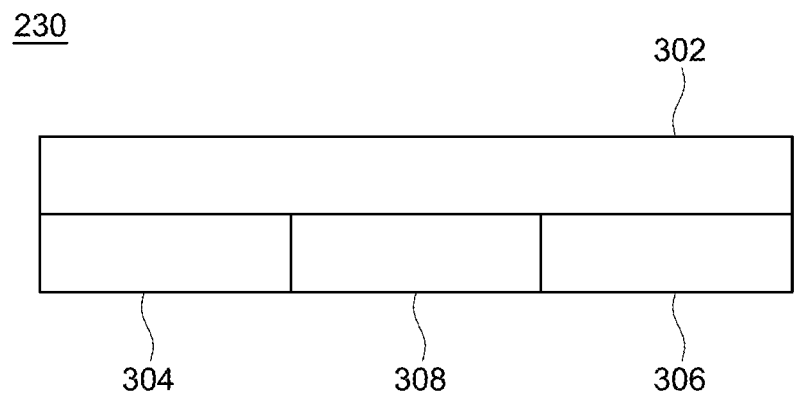
FIG. 3A is a diagram of an example LED die.

FIG. 3A is a diagram of an example LED die 230 that may be attached to a wavelength converting structure, as described above. In the example illustrated in FIG. 3A, the LED die 230 includes a light emitting semiconductor structure 302. Contacts 304 and 306 may be coupled to the light emitting semiconductor structure 302, either directly or via another structure such as a submount, for electrical connection to a circuit board or other substrate or device. In embodiments, the contacts 304 and 306 may be electrically insulated from one another by a gap 308, which may be filled with a dielectric material.

The light emitting semiconductor structure 302 may be any light emitting semiconductor structure that emits light that may be converted to light having a different color point via a wavelength converting material. For example, the light emitting semiconductor structure 302 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 304 and 306 may be formed from a solder, such as AuSn, AuGa, AuSi or SAC solders.

Figure 3B:
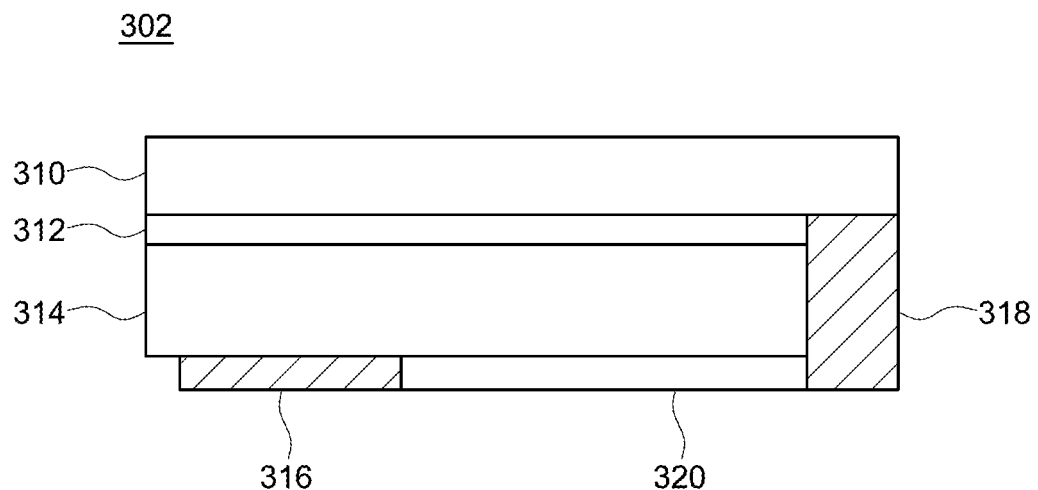
FIG. 3B is a diagram of an example light emitting semiconductor structure that may be included in the LED die of FIG. 3A.

FIG. 3B is a diagram of an example light emitting semiconductor structure 302 that may be included in the LED die 230 of FIG. 3A. The illustrated example is a flip chip structure. However, one of ordinary skill in the art will understand that the embodiments described herein may be applied to other types of LED designs, such as vertical, lateral, and multi-junction devices.

In the example illustrated in FIG. 3B, the light emitting semiconductor structure 302 includes a light emitting active region 312 disposed between a semiconductor layer or region of n-type conductivity (also referred to as an n-type region) 310 and a semiconductor layer or region of p-type conductivity (also referred to as a p-type region) 314. Contacts 316 and 318 are disposed in contact with a surface of the light emitting semiconductor structure 302 and electrically insulated from one another by a gap 320, which may be filled by a dielectric material, such as an oxide or nitride of silicon (i.e., $SiO_2$ or $Si_3N_4$). In the illustrated embodiment, contact 316 (also referred to as a p-contact) is in direct contact with a surface of the p-type region 314, and the contact 318 (also referred to as an n-contact) is in direct contact with a surface of the n-type region 310. Although not shown in FIG. 3B, a dielectric material, such as disposed in the gap 320, may also line side walls of the light emitting active region 312 and p-type region 314 to electrically insulate those regions from the contact 318 to prevent shorting of the p-n junction.

The n-type region 310 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 310, the p-type region 314 may include multiple layers of different composition, thickness, and dopant concentrations, including layers that are not intentionally doped, or n-type layers. While layer 310 is described herein as the n-type region and layer 314 is described herein as the p-type region, the n-type and p-type regions could also be switched without departing from the scope of the embodiments described herein.

The light emitting active region 312 may be, for example, a p-n diode junction associated with the interface of p-region 314 and n-region 310. Alternatively, the light emitting active region 312 may include one or more semiconductor layers that are doped n-type or p-type or are un-doped. For example, the light emitting active region 312 may include a single thick or thin light emitting layer. This includes a homojunction, single heterostructure, double heterostructure, or single quantum well structure. Alternatively, the light emitting active region 312 may be a multiple quantum well light emitting region, which may include multiple quantum well light emitting layers separated by barrier layers.

The p-contact 316 may be formed on a surface of the p-type region 314. The p-contact 316 may include multiple conductive layers, such as a reflective metal and a guard metal, which may prevent or reduce electromigration of the reflective metal. The reflective metal may be silver or any other suitable material, and the guard metal may be TiW or TiWN. The n-contact 318 may be formed in contact with a surface of the n-type region 310 in an area where portions of the active region 312, the n-type region 310, and the p-contact 316 have been removed to expose at least a portion of the surface of the n-type region 310. The sidewall of the exposed mesa or via may be coated with a dielectric to prevent shorting. The contacts 316 and 318 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 316 and 318 may be formed from transparent conductors, such as indium tin oxide.

The n-contact 318 and p-contact 316 are not limited to the arrangement illustrated in FIG. 3B and may be arranged in any number of different ways. In embodiments, one or more n-contact vias may be formed in the light emitting semiconductor structure 302 to make electrical contact between the re-contact 318 and the n-type layer 310. Alternatively, the n-contact 318 and p-contact 316 may be redistributed to form bond pads with a dielectric/metal stack as known in the art. The p-contact 316 and the n-contact 318 may be electrically connected to the contacts 304 and 306 of FIG. 3A, respectively, either directly or via another structure, such as a submount.

Figure 3C:
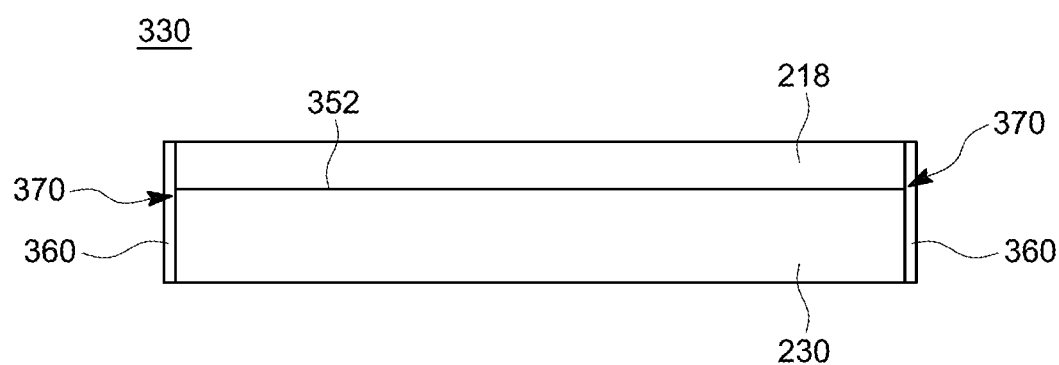
FIG. 3C is a diagram of an example LED that may include the LED die of FIG. 3A.

FIG. 3C is a diagram of an example LED 330. In the example illustrated in FIG. 3C, the LED 330 includes an LED die 230. A wavelength converting structure 218 is disposed in direct contact with a surface 352 of the LED die 230. A thin film reflector 360, such as a Bragg reflector, may be a coating on side surfaces 370 of a structure formed from the LED die 230 and the wavelength converting structure 218 such that the thin film reflector 360 may be in direct contact with side surfaces of both the wavelength converting structure 218 and the LED die 230. The wavelength converting structure 218 having properties such as described above has sufficient CTE match with the thin film reflector 360 such that the thin film reflector 360 does not crack when in direct contact with the wavelength converting structure 218. Further, the wavelength converting structure 218 may have a roughness of 100 nm or less, as described in detail above, which is sufficient for use with the thin film reflector 360 such that un-converted pump light and converted light do not leak through the side surfaces 370 and through the thin film reflector 360.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A method of manufacturing a light emitting device (LED), the method comprising:

providing a layer of a wavelength converting material, the wavelength converting material comprising a binder or matrix material, particles of a non-luminescent material, and phosphor particles, the wavelength converting material having a concentration of greater than 60% by volume of the non-luminescent material and phosphor particles;

separating the layer of the wavelength converting material into a plurality of wavelength converting structures, one of the plurality of wavelength converting structures having a first surface, a second surface opposite the first surface, and side surfaces created by the separation;

placing the one wavelength converting structure in a frame having an interior area defined by one or more surfaces of the frame;

applying heat to and compressing the one wavelength converting structure to cause the wavelength converting material in the structure to flow, to cover the interior area, and to contact a surface of the frame to create a new wavelength converting structure side surface after applying heat to and compressing the one wavelength converting structure, attaching a light emitting die to the one wavelength converting structure to form a light emitting device.

2. The method of claim 1, wherein the new side surface has a roughness of less than 100 nm.

3. The method of claim 1, wherein attaching a light emitting die to the one wavelength converting structure comprises attaching the light emitting die without using adhesive.

4. The method of claim 1, comprising coating the new side surface with a thin film of a non-metallic reflector.

5. The method of claim 4, wherein the non-metallic reflector is a Bragg reflector with a thickness of 1-10 microns.

6. The method of claim 4, wherein both the wavelength converting material and the non-metallic reflector have a coefficient of thermal expansion between 6 and 20 ppm.

7. The method of claim 1, wherein the binder or matrix material is silicone and the non-luminescent material is silica ($SiO_2$).

8. The method of claim 1, wherein applying heat and compressing further comprises heating the one wavelength converting structure to a temperature of between 50° C. and 90° C. and subjecting the one wavelength converting structure to a pressure of between 0.7 and 0.8 Mpa.

9. The method of claim 1, wherein the binder or matrix material and the non-luminescent material are chosen at least in part based on their indices of refraction.

10. The method of claim 1, wherein the separating the layer of the wavelength converting material comprises sawing the layer of the wavelength converting material.

11. The method of claim 1, wherein the concentration of non-luminescent and phosphor particles in the wavelength converting material is greater than 70% by volume.

12. The method of claim 1, wherein the concentration of non-luminescent and phosphor particles in the wavelength converting material is about 90% by volume.

13. The method of claim 1, comprising before separating the layer of the wavelength converting material into the plurality of wavelength converting structures, placing the layer of the wavelength converting material on a temporary tape.

14. The method of claim 1, wherein the frame is an array type frame.

15. The method of claim 1, wherein the frame is adhered to a tape.

16. The method of claim 1, wherein attaching the light emitting die to the one wavelength converting structure comprises using heat to attach the light emitting die to the one wavelength converting structure.

17. The method of claim 1, comprising after attaching the light emitting die to the one wavelength converting structure, separating the light emitting device from the frame.

\* \* \* \* \*